US012635324B2

(12) United States Patent
Ahn

(10) Patent No.: US 12,635,324 B2
(45) Date of Patent: May 19, 2026

(54) DISPLAY PANEL AND DISPLAY DEVICE

(71) Applicant: LG Display Co., Ltd., Seoul (KR)

(72) Inventor: Jiyoung Ahn, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 492 days.

(21) Appl. No.: 18/354,523

(22) Filed: Jul. 18, 2023

(65) Prior Publication Data

US 2024/0222582 A1     Jul. 4, 2024

(30) Foreign Application Priority Data

Dec. 30, 2022     (KR) ........................ 10-2022-0190603

(51) Int. Cl.
| | | |
|---|---|---|
| *H01L 33/62* | (2010.01) | |
| *H10H 20/832* | (2025.01) | |
| *H10H 20/855* | (2025.01) | |
| *H10H 20/857* | (2025.01) | |
| *H10W 90/00* | (2026.01) | |

(52) U.S. Cl.
CPC ........ *H10H 20/857* (2025.01); *H10H 20/835* (2025.01); *H10H 20/855* (2025.01); *H10W 90/00* (2026.01)

(58) Field of Classification Search
CPC .. H10H 20/857; H10H 20/835; H10H 20/855; H10H 20/856; H10H 29/142; H10H 20/853; H10H 20/8506; H01L 25/0753; H01L 25/167; H10D 86/441
See application file for complete search history.

(56) References Cited

U.S. PATENT DOCUMENTS

| | | | |
|---|---|---|---|
| 2011/0227080 A1* | 9/2011 | Roh ..................... | G02B 26/005 |
| | | | 257/E33.053 |
| 2020/0135971 A1 | 4/2020 | Beak et al. | |
| 2021/0327865 A1* | 10/2021 | Yamazaki ............. | H01L 25/167 |
| 2022/0005790 A1* | 1/2022 | Watanabe ........... | H01L 25/0753 |
| 2022/0320055 A1 | 10/2022 | Choi et al. | |

FOREIGN PATENT DOCUMENTS

| | | |
|---|---|---|
| KR | 20200049394 A | 5/2020 |
| KR | 20210083680 A | 7/2021 |

* cited by examiner

*Primary Examiner* — Elmito Breval

(74) *Attorney, Agent, or Firm* — Seed Intellectual Property Law Group LLP

(57) ABSTRACT

Disclosed are a display panel and a display device in which a reflective electrode layer having a pattern corresponding to a lower surface of a light-emitting element is disposed under the light-emitting element. Thus, light efficiency and light reflectance of an area corresponding to the light-emitting element are increased while a reflectance is lowered in an area other than the area corresponding to the light-emitting element. Thus, light efficiency and light reflectance of the light-emitting element are increased while improving black reflection visibility.

20 Claims, 16 Drawing Sheets

L1        L2

DISPLAY PANEL AND DISPLAY DEVICE

CROSS-REFERENCE TO RELATED APPLICATION

This application claims priority from Korean Patent Application No. 10-2022-0190603 filed on Dec. 30, 2022, in the Korean Intellectual Property Office, and all the benefits accruing therefrom under 35 U.S.C. 119, the contents of which in its entirety are herein incorporated by reference.

BACKGROUND

Technical Field

The present disclosure relates to a display panel and a display device, and more particularly, to a display panel and a display device including a micro-LED.

Description of the Related Art

A display device is implemented in very diverse forms such as televisions, monitors, smart phones, tablet PCs, laptops, and wearable devices.

For example, a display device using a micro-LED (light-emitting diode) with a microscopic size as a light-emitting element has high image quality and high reliability.

The micro-LED element is a semiconductor light-emitting element that emits light when current flows in a semiconductor, and has recently been widely used in various fields such as a lighting field as well as a display field.

A micro-LED display device may be manufactured by crystallizing micro-LED elements on a semiconductor (wafer) substrate, and then transferring the crystallized micro-LED elements to a separate substrate with a driving element.

BRIEF SUMMARY

The transferring of the micro-LED elements to the separate substrate may be performed in a transfer process of transferring the micro-LED elements to positions corresponding to pixels formed in the separate substrate.

The transfer process is a very sophisticated process because it is desirable to transfer each of the micro-LED elements to a location of each of the pixels already formed in the substrate as precisely as possible.

For example, in order to increase the light efficiency of the micro-LED element, a reflective plate having high reflectance that can reflect light from the micro-LED element as efficiently as possible may be disposed.

Therefore, when the micro-LED element is disposed on the reflective plate of the high reflectance, the light efficiency of the micro-LED element may be improved.

In this case, the reflective plate may be actually formed in an area larger than an area size of a light-emitting area including the micro-LED element in consideration of an alignment margin during the transfer process of the micro-LED elements.

However, when the reflective plate of the high reflectance is disposed in the larger area in this way, the light reflectance may be increased, while black reflection visibility may be deteriorated due to high light reflectance.

In particular, in a display device without a polarizer, the black reflection visibility may be further deteriorated due to the high light reflectance.

Accordingly, the inventors of the present disclosure conducted several experiments in order to obtain a display panel and a display device having optimized light efficiency and reflectance.

Through the various experiments, the inventors of the present disclosure have invented a display panel and a display device having optimized light efficiency and light reflectance while improving the black reflection visibility.

One or more embodiments of the present disclosure provide a display panel and a display device capable of improving the black reflection visibility while increasing light efficiency of a light-emitting element.

One or more embodiments of the present disclosure provide a display panel and a display device capable of increasing light efficiency of a light-emitting element while not being affected by the transfer alignment margin of the light-emitting element.

One or more embodiments of the present disclosure provide a display panel and a display device capable of increasing process efficiency in a process of forming a reflective electrode layer that increases light efficiency of a light-emitting element.

One or more embodiments of the present disclosure provide a display panel and a display device including another constituent layer capable of serving as a reflective plate of low reflectance instead of a reflective plate disposed under a light-emitting element.

One or more embodiments of the present disclosure provide a low-power display panel and a low-power display device.

One or more embodiments of the present disclosure provide a display panel and a display device having a eco-friendly part.

The technical benefits of the present disclosure are not limited to the above-mentioned benefits. Other benefits and advantages according to the present disclosure that are not mentioned may be understood based on following descriptions, and may be more clearly understood based on embodiments according to the present disclosure. Further, it will be easily understood that the benefits and advantages according to the present disclosure may be realized using means shown in the claims or combinations thereof.

Each of a display panel and a display device according to an embodiment of the present disclosure includes a substrate; a reflective plate disposed on the substrate; a reflective electrode layer disposed on the reflective plate; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the reflective plate.

Each of a display panel and a display device according to an embodiment of the present disclosure includes a substrate; a reflective plate disposed on the substrate; a fixing layer disposed on the reflective plate; a reflective electrode layer disposed on the fixing layer; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the fixing layer.

According to the embodiment of the present disclosure, the reflective electrode layer having a pattern corresponding to the lower surface of the light-emitting element may be disposed under the light-emitting element. Thus, the light efficiency and light reflectance of the area corresponding to the light-emitting element may be increased while the reflectance may be lowered in an area other than the area corresponding to the light-emitting element. Thus, the light efficiency and light reflectance of the light-emitting element may be increased while improving black reflection visibility.

In addition, according to the embodiment of the present disclosure, the reflective electrode layer having a pattern corresponding to the lower surface of the light-emitting element may be disposed under the light-emitting element. Thus, the transfer process of the light-emitting element may not be affected by the transfer alignment margin. Thus, the pattern of the reflective electrode layer may not be unnecessarily large. Thus, the light efficiency and light reflectance of the light-emitting element may be optimized.

In addition, according to the embodiment of the present disclosure, the plurality of reflective electrode layers may respectively serve as the first electrode and the second electrode electrically connected to the light-emitting element. Thus, a separate first electrode and a separate second electrode other than the reflective electrode layer may be not formed. Thus, the process efficiency may be increased, and the process may be optimized.

In addition, according to the embodiment of the present disclosure, the fixing layer disposed under the light-emitting element may be act a constituent layer that may serve as a low reflectance reflective plate. Thus, not only a freedom in terms of a material choice of the reflective plate may be increased, but also the light reflectance of an area other than the area corresponding to the light-emitting element may be more effectively lowered.

In addition, according to the embodiment of the present disclosure, the fixing layer may act as a constituent layer that may serve as the low-reflectance reflective plate, the low-reflective layer may be formed under the light-emitting element without patterning the reflective plate or without forming an additional layer. Thus, a very effective low reflective layer may be formed by improving the black performance while obtaining high process efficiency.

In addition, according to the embodiment of the present disclosure, the display panel and the display device with high light efficiency may be realized. Thus, a low-power display panel and display device may be realized to reduce power consumption.

In addition, according to the embodiment of the present disclosure, the display panel and the display device having the fixing layer that serves as the low reflectance reflective plate may be provided. Thus, a Uni-material may be used to provide an eco-friendly part that may be recycled.

In addition to the above effects, specific effects of the present disclosure are described together while describing specific details for carrying out the present disclosure.

Effects of the present disclosure are not limited to the effects mentioned above, and other effects not mentioned will be clearly understood by those skilled in the art from the descriptions below.

DETAILED DESCRIPTION

Figure 1:
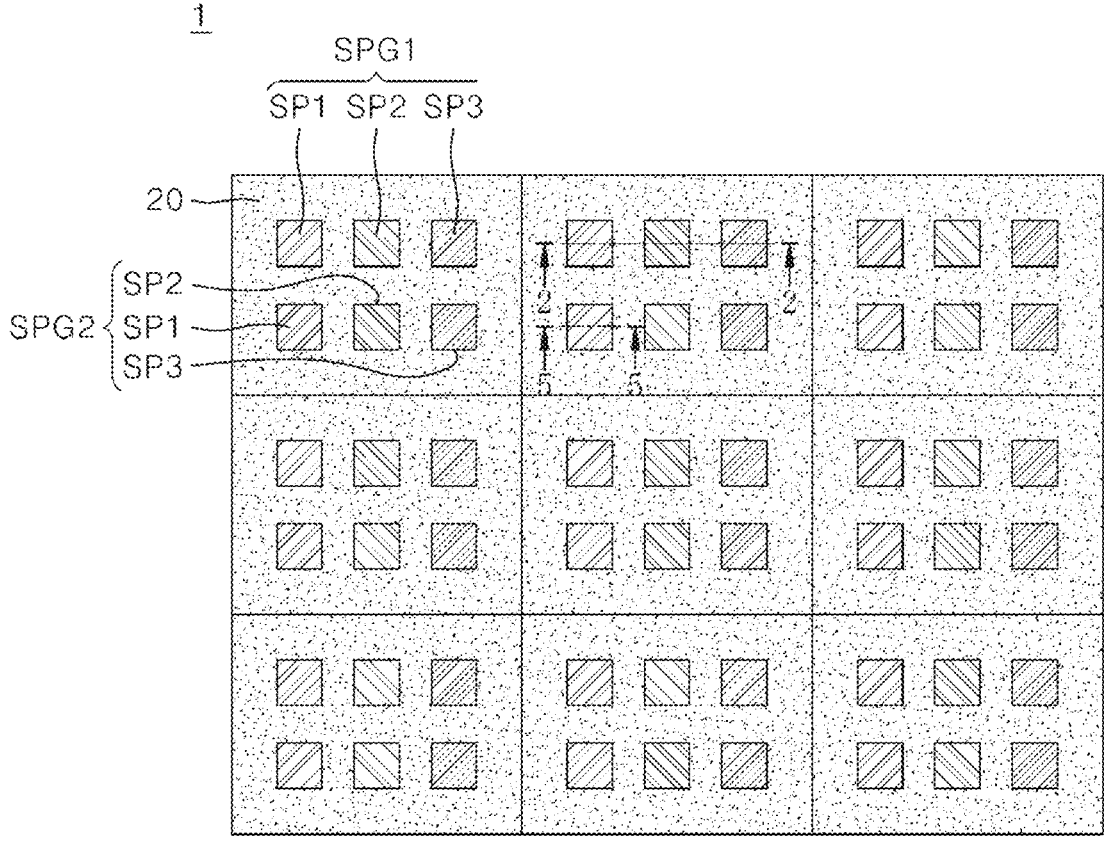
FIG. 1 is a plan view of a display device according to a first embodiment to a fifth embodiment of the present disclosure.

Advantages and features of the present disclosure, and a method of achieving the advantages and features will become apparent with reference to embodiments described later in detail together with the accompanying drawings. However, the present disclosure is not limited to the embodiments as disclosed under, but may be implemented in various different forms. Thus, these embodiments are set forth only to make the present disclosure complete, and to completely inform the scope of the present disclosure to those of ordinary skill in the technical field to which the present disclosure belongs.

For simplicity and clarity of illustration, elements in the drawings are not necessarily drawn to scale. The same reference numbers in different drawings represent the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure. Examples of various embodiments are illustrated and described further below. It will be understood that the description herein is not intended to limit the claims to the specific embodiments described. On the contrary, it is intended to cover alternatives, modifications, and equivalents included within the spirit and scope of the present disclosure.

A shape, a size, a dimension (e.g., length, width, height, thickness, radius, diameter, area, etc.), a ratio, an angle, a number of elements, etc., disclosed in the drawings for describing embodiments of the present disclosure are illustrative, and the present disclosure is not limited thereto. The same reference numerals refer to the same elements herein.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The terminology used herein is directed to the purpose of describing particular embodiments only and is not intended to be limiting of the present disclosure. As used herein, the singular constitutes "a" and "an" are intended to include the plural constitutes as well, unless the context clearly indicates otherwise. It will be further understood that the terms "comprise", "including", "include", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of associated listed items. Expression such as "at least one of" when preceding a list of elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

When a certain embodiment may be implemented differently, a function or an operation specified in a specific block may occur in a different order from an order specified in a flowchart. For example, two blocks in succession may be actually performed substantially concurrently, or the two blocks may be performed in a reverse order depending on a function or operation involved.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

In interpreting a numerical value, the value is interpreted as including an error range unless there is no separate explicit description thereof.

It will be understood that when an element or layer is referred to as being "connected to", or "connected to" another element or layer, it may be directly on, connected to, or connected to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

As used herein, "embodiments," "examples," "aspects, and the like should not be construed such that any aspect or design as described is superior to or advantageous over other aspects or designs.

Further, the term 'or' means 'inclusive or' rather than 'exclusive or'. That is, unless otherwise stated or clear from the context, the expression that 'x uses a or b' means any one of natural inclusive permutations.

The terms used in the description below have been selected as being general and universal in the related technical field. However, there may be other terms than the terms depending on the development and/or change of technology, convention, preference of technicians, etc. Therefore, the terms used in the description below should not be understood as limiting technical ideas, but should be understood as examples of the terms for describing embodiments.

Further, in a specific case, a term may be arbitrarily selected by the applicant, and in this case, the detailed meaning thereof will be described in a corresponding description section. Therefore, the terms used in the description below should be understood based on not simply the name of the terms, but the meaning of the terms and the contents throughout the Detailed Descriptions.

Hereinafter, with reference to FIG. 1 to FIG. 16, a display panel and a display device according to the first embodiment to the fifth embodiment of the present disclosure will be described in detail.

Figure 2:
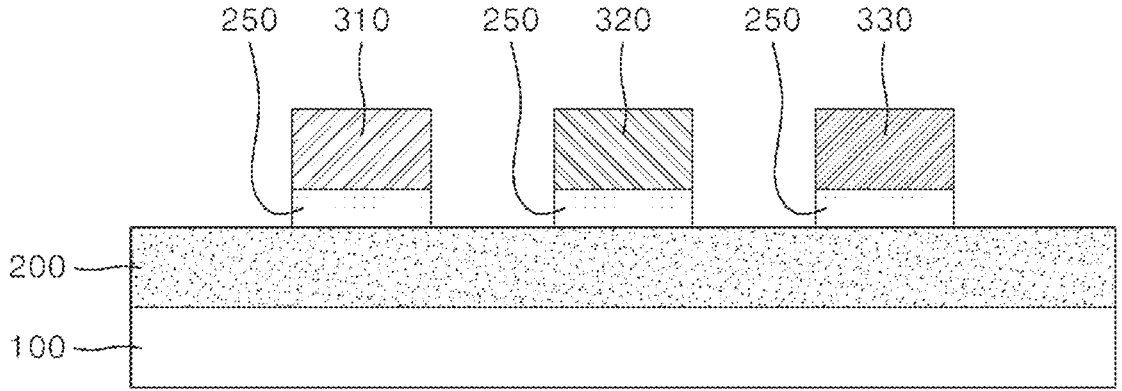
FIG. 2 is a cross-sectional view of a display device corresponding to one pixel according to a first embodiment to a third embodiment of the present disclosure.
Figure 3:
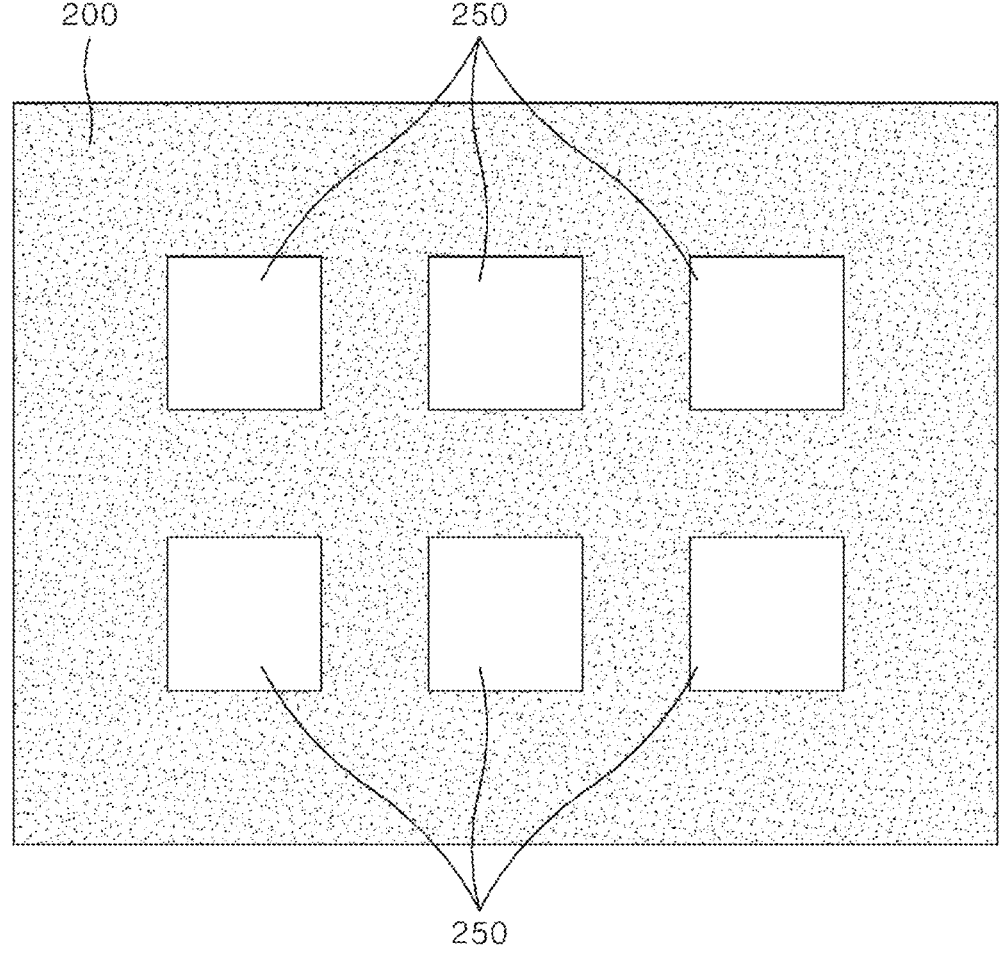
FIG. 3 is a plan view of a reflective plate corresponding to one pixel according to a first embodiment to a third embodiment of the present disclosure.

Referring to FIG. 1 to FIG. 3, a display device 1 may include a plurality of unit display panels 20.

A cross-sectional view taken along a line 2-2 as shown in FIG. 1 corresponds to FIG. 2. FIG. 4, FIG. 7, FIG. 8, and FIG. 10, and a cross-sectional view taken along a line 5-5 as shown in FIG. 1 corresponds to FIG. 5, FIG. 6, FIG. 9, and FIG. 11.

In the present disclosure, it is illustrated that the plurality of unit display panels 20 are collected to constitute the display device 1. However, the present disclosure is not limited thereto, and the plurality of unit display panels 20 are collected to constitute one display panel 20.

The display panel 20 may include a substrate 100 and a plurality of light-emitting elements 310, 320, and 330 mounted on the substrate 100.

The substrate 100 may be made of a transparent material such as glass. However, the present disclosure is not limited thereto.

The substrate 100 may be a thin-film transistor (TFT) array substrate.

Accordingly, a thin-film transistor and various lines for driving the light-emitting element 300 may be formed in a pixel area P on the substrate 100.

When the thin-film transistor is turned on, a driving signal input from an external source is applied to the light-emitting element 300 via the various lines so that the light-emitting element 300 emits light. Thus, an image may be displayed.

The unit display panel 20 may include a first sub-pixel group SPG1 and a second sub-pixel group SPG2 on the substrate 100. The first sub-pixel group SPG1 and the second sub-pixel group SPG2 may be grouped together to define one pixel P. However, the present disclosure is not limited thereto.

Each of the first sub-pixel group SPG1 and the second sub-pixel group SPG2 may include a first sub-pixel SP1, a second sub-pixel SP2, and a third sub-pixel SP3.

A plurality of light-emitting elements 300 disposed on the substrate 100 may include a first color light-emitting element 310, a second color light-emitting element 320, and a third color light-emitting element 330.

In this case, the first color light-emitting element 310 may render a red color (R), the second color light-emitting element 320 may render a green color (G), and the third color light-emitting element 330 may render a blue color (B).

The first color light-emitting element 310 may be transferred to a position corresponding to the first sub-pixel SP1. The second color light-emitting element 320 may be transferred to a position corresponding to the second sub-pixel SP2. The third color light-emitting element 330 may be transferred to a position corresponding to the third sub-pixel SP3.

The present disclosure describes an example in which the light-emitting element 300 is embodied as a micro-LED element. However, the present disclosure is not limited thereto.

For example, the light-emitting element 300 may be embodied as a micro-LED element having a size of about 10 to 100 μm.

The light-emitting elements 300 may be manufactured in a process separate from a thin-film transistor array process of the substrate 100.

The light-emitting elements 300 may be formed in a process of growing a plurality of thin-films made of an inorganic material on a sapphire substrate or a silicon substrate and then cutting and separating the sapphire substrate or the silicon substrate into a plurality of portions.

The plurality of light-emitting elements 300 thus formed may be transferred onto the substrate 100 of the display panel 20 and thus may be converted to the light-emitting elements 300 of the display panel 20.

In one example, a reflective electrode layer 250 having a pattern corresponding to a lower surface of the light-emitting element 300 may be disposed under the light-emitting element 300.

The reflective electrode layer 250 may be made of a metal layer having high reflectance to effectively reflect the light from the light-emitting element 300.

For example, the reflective electrode layer 250 may include aluminum (Al) or silver (Ag).

The reflective electrode layer 250 may be formed integrally with the light-emitting element 300 and may be disposed thereunder.

For example, before a process of transferring the light-emitting element 300 to the substrate 100 of the display panel 20, the reflective electrode layer 250 may be formed under the light-emitting element 300.

A scheme of forming the reflective electrode layer 250 under the light-emitting element 300 may include fixing the reflective electrode layer 250 to a bottom surface of the light-emitting element 300 using an adhesive layer. However, the present disclosure is not limited thereto.

Therefore, during the transfer process of the light-emitting element 300, the reflective electrode layer 250 together with the light-emitting element 300 may be transferred to the substrate 100 in a state in which the reflective electrode layer 250 has been integrally formed with the light-emitting element 300.

In this way, the reflective electrode layer 250 has the pattern corresponding to the lower surface of the light-emitting element 300 and is integrally formed with the light-emitting element. Thus, even when in the transfer process of the light-emitting element 300, the light-emitting element 300 is misaligned with a target position, a state may be maintained in which the reflective electrode layer 250 is positioned under the lower surface of the light-emitting element 300.

Therefore, according to an embodiment of the present disclosure, the reflective electrode layer 250 having the pattern corresponding to the lower surface of the light-emitting element 300 may be disposed. Thus, the transfer process of the light-emitting element 300 may not be affected by the transfer alignment margin. Thus, the pattern of the reflective electrode layer 250 may not be unnecessarily large. Thus, the light efficiency and light reflectance of the light-emitting element 300 may be optimized.

A plurality of pixel areas P arranged in a matrix manner may be defined in the substrate 100 and may be defined by a plurality of gate lines and a plurality of data lines overlapping each other.

In this case, the gate line and the data line may be connected to the light-emitting element 300.

A gate pad and a data pad connected to an external source may be provided at ends of the gate line and the data line, respectively. Thus, an external signal is applied to the light-emitting element 300 via the gate line and the data line. The light-emitting element may operate to emit light.

A reflective plate 200 may be disposed on the substrate 100.

Specifically, the reflective plate 200 may be disposed between the substrate 100 and the light-emitting element 300. The reflective plate 200 may be disposed under the light-emitting element 300.

The reflective plate 200 may allow the light emitted from the light-emitting element 300 to be reflected therefrom in an upward direction.

However, the reflective plate 200 according to an embodiment of the present disclosure may be formed to have reflectance of light of a wavelength of 550 nm lower than that of the reflective electrode layer 250.

The reflectance of light of a wavelength of 550 nm of the reflective electrode layer 250 may be higher than that of light of a wavelength of 550 nm of the reflective plate 200.

Therefore, the reflective electrode layer 250 may be a relatively high reflectance area compared to the reflective plate 200. The reflective plate 200 may be a relatively low reflectance area compared to the reflective electrode layer 250.

Hereinafter, the light reflectance described in the present disclosure refers to light reflectance measured based on light having a wavelength of 550 nm.

The reflective plate 200 may be formed to cover an entire surface of the unit display panel 20. However, the present disclosure is not limited thereto, and the reflective plate 200 may be patterned in a corresponding manner to each of the sub-pixels SP formed in the unit display panel 20.

The reflective plate 200 may be disposed in a corresponding manner to a combination of a plurality of sub-pixels SP, while the reflective electrode layer 250 may be disposed in a corresponding manner to each sub-pixel SP.

For example, the reflective electrode layer 250 may be positioned in an area corresponding to each sub-pixel SP in the unit display panel 20.

Therefore, in a plan view as shown in FIG. 3, the reflective plate 200 may be disposed in the remaining area except for the reflective electrode layer 250.

Therefore, in the unit display panel 20, a plurality of reflective electrode layers 250 may be arranged. The reflective electrode layers 250 adjacent to each other may be arranged to be spaced apart from each other.

In the plan view as shown in FIG. 3, the reflective plate 200 may be disposed to surround the plurality of reflective electrode layers 250 arranged in the above-described manner.

A total area size of the reflective plate 200 as the low reflectance area may be greater than a total area size of the reflective electrode layer 250 as the high reflectance area.

The reflective plate 200 according to an embodiment of the present disclosure may be formed to have the reflectance as low as possible such that the black reflection visibility may be improved. The reflective electrode layer 250 having the high reflectance is disposed in an area corresponding to the lower surface of the light-emitting element 300 which benefits from having a substantially high reflectance. Thus, very high light efficiencies may be obtained.

That is, according to an embodiment of the present disclosure, the reflective electrode layer 250 having the pattern corresponding to the lower surface of the light-emitting element 300 may be disposed under the light-emitting element 300. Thus, the light efficiency and light reflectance of the area corresponding to the light-emitting element 300 may be increased. However, the light reflectance may be lowered in an area other than the area corresponding to the light-emitting element 300. Thus, the light efficiency and the light reflectance of the light-emitting element 300 may be increased while improving the black reflection visibility.

Hereinafter, various embodiments capable of lowering the reflectance of the reflective plate 200 according to an embodiment of the present disclosure will be described in more detail.

Figure 4:
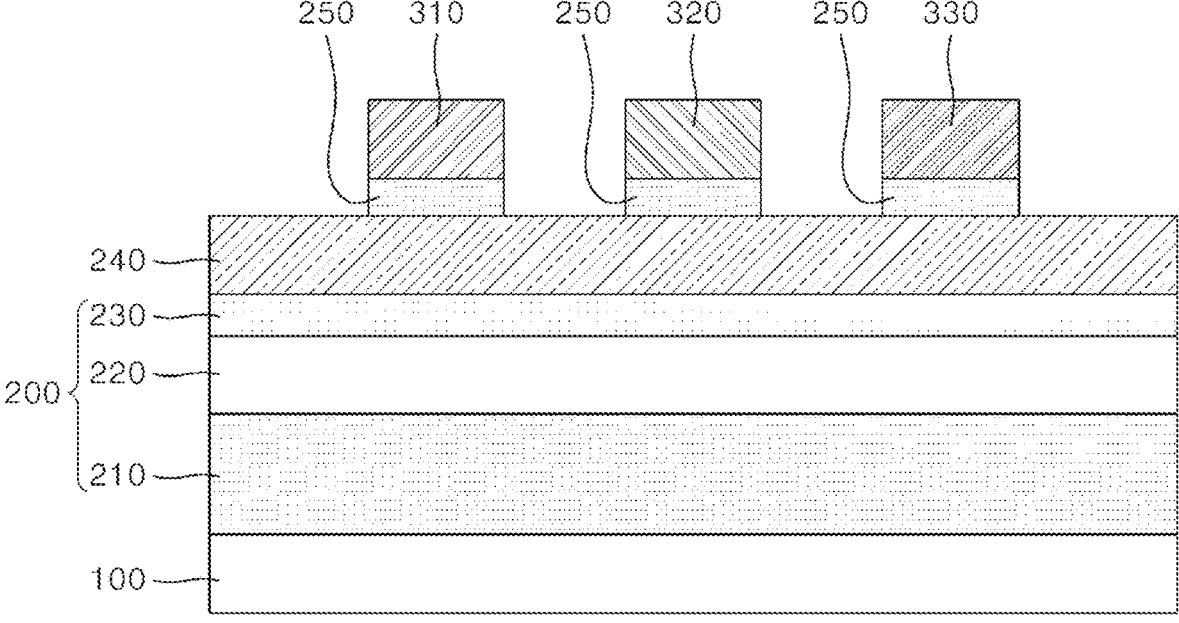
FIG. 4 is a cross-sectional view of a display device corresponding to one pixel according to a first embodiment and a second embodiment of the present disclosure.
Figure 5:
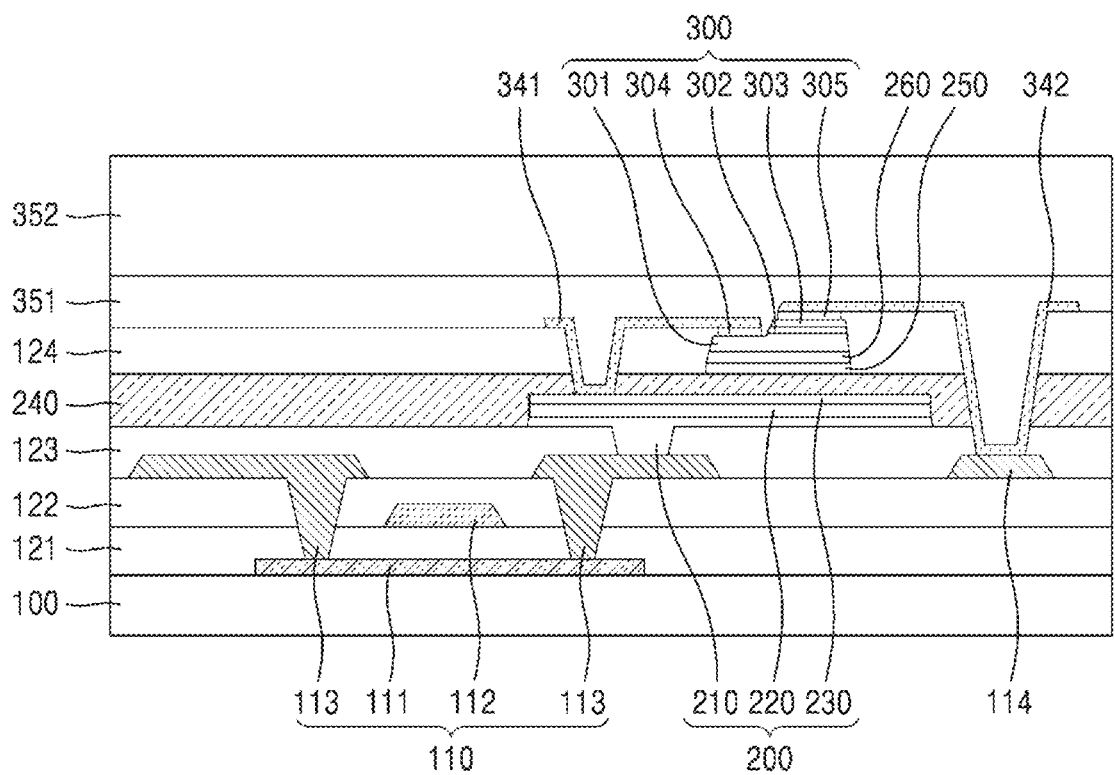
FIG. 5 is a cross-sectional view of a display device corresponding to one sub-pixel according to a first embodiment of the present disclosure.

Referring to FIG. 4 and FIG. 5, the reflective plate 200 according to a first embodiment may include a first reflective plate layer 210, a second reflective plate layer 220, and a third reflective plate layer 230 sequentially stacked.

Each of the first reflective plate layer 210 and the third reflective plate layer 230 may be a metal layer.

The metal layer may include one or more materials selected from aluminum (Al), silver (Ag), molybdenum (Mo), and titanium (Ti), or may include an alloy of two or more thereof. However, the present disclosure is not limited thereto.

For example, when a metal layer is made of a metal having a light reflectance of 60% at a wavelength of 550 nm, or when a metal layer is made of a metal having a light reflectance of 60% and a light transmittance of 30% or greater at a wavelength of 500 nm, the metal layer may be used as each of the first reflective plate layer 210 and the third reflective plate layer 230.

The first reflective plate layer 210 and the third reflective plate layer 230 as the metal layer may include the same metal.

For example, the first reflective plate layer 210 and the third reflective plate layer 230 may be made of the same material including aluminum (Al).

Accordingly, light reflectance of the first reflective plate layer 210 and the third reflective plate layer 230 may be equal to each other.

However, the light reflectance of the first reflective plate layer 210 and the light reflectance of the third reflective plate layer 230 may be adjusted to be different from each other by adjusting a thickness of each of the first reflective plate layer 210 and the third reflective plate layer 230.

Alternatively, the first reflective plate layer 210 and the third reflective plate layer 230 as the metal layer may include different metals.

In this case, the metal included in the third reflective plate layer 230 may be a metal having lower light reflectance than that of the metal included in the first reflective plate layer 210.

Accordingly, the third reflective plate layer 230 may have reflectance of light of a wavelength of 550 nm lower than that of the first reflective plate layer 210.

For example, the first reflective plate layer 210 may include aluminum (Al), and the third reflective plate layer 230 may include molybdenum (Mo). Thus, the first reflective plate layer 210 and the third reflective plate layer 230 as the metal layer may include different metals.

Aluminum (Al) may have a light reflectance of approximately 80% to 90%, while molybdenum (Mo) may have a light reflectance of approximately 40% to 50%.

The first reflective plate layer 210 and the third reflective plate layer 230 may have different thicknesses.

For example, the thickness of the third reflective plate layer 230 may be smaller than the thickness of the first reflective plate layer 210. The third reflective plate layer 230 may be formed in a form of a very thin metal thin-film compared to the first reflective plate layer 210.

When the third reflective plate layer 230 is thinner than the first reflective plate layer 210, a portion of the light emitted from the light-emitting element 300 and then directed to the reflective plate 200 may pass through the third reflective plate layer 230. However, a substantial amount of the light emitted from the light-emitting element 300 and then directed to the reflective plate 200 may be reflected from the first reflective plate layer 210 having a relatively larger thickness and then may travel upwardly.

In this way, the thickness of each of the first reflective plate layer 210 and the third reflective plate layer 230 may be adjusted such that the high and low reflectance areas may be easily implemented in a separate manner.

The second reflective plate layer 220 may be a transparent layer.

The transparent layer may be a conductive oxide layer or a transparent insulating layer.

For example, the conductive oxide layer may be made of indium-tin-oxide (ITO), indium-zinc-oxide (IZO), or indium-gallium-zinc-oxide (IGZO). The transparent insulating layer may be made of $SiO_x$, $SiN_x$, $SiO_2$, SiON, or the like.

The reflective plate 200 as described above may act as the low reflectance reflective plate 200 having a stack structure of the first reflective plate layer 210, the second reflective plate layer 220, and the third reflective plate layer 230.

Figure 15:
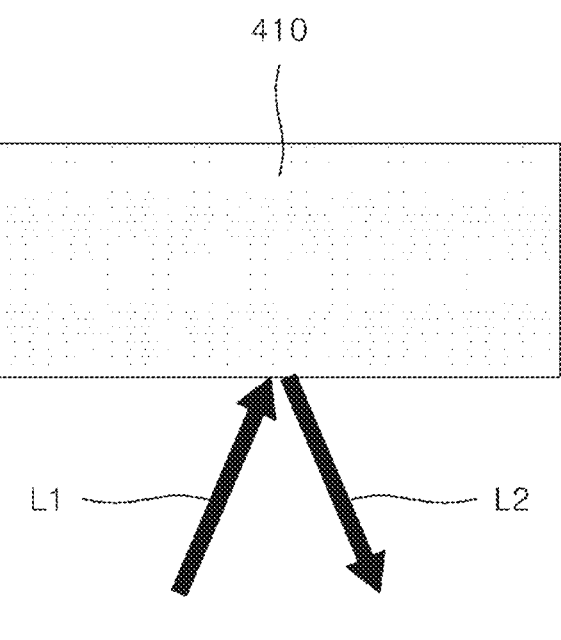
FIG. 15 shows that light is reflected from one reflective plate layer at a high reflectance.
Figure 16:
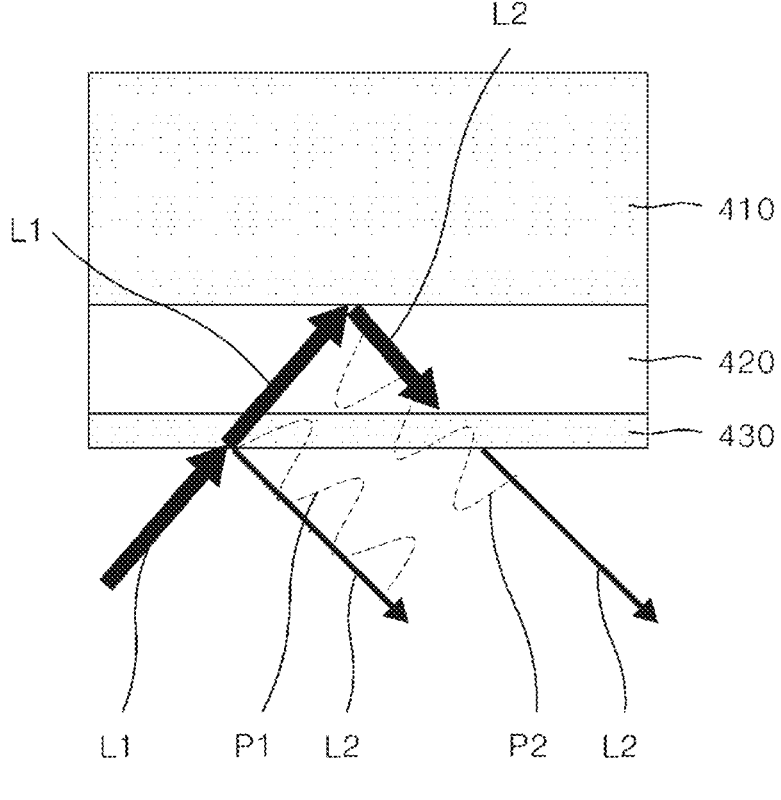
FIG. 16 shows that light is reflected from a triple-layers reflective plate according to an embodiment of the present disclosure at a low reflectance.

The light reflectance of the reflective plate 200 having such a structure may be described with referring to FIG. 15 and FIG. 16.

FIG. 15 is an experiment of reflectance of a single metal layer based on incident light L1 and reflected light L2.

In this case, a first layer 410 is embodied as a single layer made of aluminum (Al) and having a thickness of 2000 Å.

The incident light L1 having a wavelength of 550 nm is incident on the first layer 410 as a single layer, and then, the reflected light L2 is measured. As a result, light reflectance of about 70% or greater is measured.

FIG. 16 is an experiment of reflectance of a reflective plate having a stack structure of three layers in which a third layer 430, a second layer 420, and the first layer 410 as a top layer are sequentially stacked based on incident light L1 and reflected light L2.

In this case, the third layer 430 is embodied as an aluminum (Al) layer having a thickness of 100 Å to 200 Å. The second layer 420 is embodied as an ITO layer having a thickness of 550 Å to 900 Å. The first layer 410 is embodied as an aluminum (Al) layer with a thickness of 2000 Å.

When the incident light L1 having a wavelength of 550 nm is incident on a reflective plate having the stack of the three layers, partial light is reflected from a surface of the third layer 430, while partial light passes through the third layer 430 and the second layer 420 and is reflected from an interface between the first layer 410 and the second layer 420 and then passes through the third layer 430 again and returns downwardly out of the stack.

In this case, the reflected light beams L2 which are reflected from the first layer 410 and the third layer 430, respectively may be generated, and may be out of phases by 180 degrees.

Therefore, as the two reflected light beams L2 are out of phases by 180 degrees, destructive interference therebetween occurs, so that actually reflected light is greatly reduced.

In this way, the incident light L1 having a wavelength of 550 nm is incident on the reflective plate composed of the three layers, and then, the reflected light L2 is measured. As a result, light reflectance of about 10% or lower is measured.

Through the above experimental examples, it may be identified that the reflective plate 200 having the three layers according to an embodiment of the present disclosure may act as the low-reflectance reflective plate 200.

Referring to FIG. 5, a cross-sectional structure corresponding to one sub-pixel SP according to the first embodiment will be described in detail.

A thin-film transistor 110 may be disposed on the substrate 100.

Specifically, an active layer 111 may be disposed on the substrate 100. A first insulating layer 121 may be disposed on the active layer 111. A gate electrode layer 112 may be disposed on the first insulating layer 121.

A second insulating layer 122 may be disposed on the gate electrode layer 112.

A pair of source/drain electrodes 113 electrically connected to the active layer 111 respectively via a pair of contact-holes formed in the first insulating layer 121 and the second insulating layer 122 may be disposed on the second insulating layer 122.

The pair of source/drain electrodes 113 may include a source electrode and a drain electrode. One of the source/drain electrodes 113 electrically connected to the light-emitting element 300 may be the drain electrode.

In addition, a common line 114 may be disposed on the second insulating layer 122. The common line 114 may apply a high-potential voltage EVDD to the light-emitting element 300.

A third insulating layer 123 may be disposed on the pair of source/drain electrodes 113 and the common line 114.

The reflective plate 200 may be disposed on the third insulating layer 123.

The reflective plate 200 may be electrically connected to the drain electrode of the source/drain electrodes 113 via a contact-hole formed in the third insulating layer 123.

In this case, the second reflective plate layer 220 may be a conductive oxide layer. Accordingly, an area in which the first reflective plate layer 210, the second reflective plate layer 220, and the third reflective plate layer 230 are stacked may be an area in which the electric current flows through the three layers.

A fixing layer 240 may be disposed on the reflective plate 200.

The fixing layer 240 may be embodied as an adhesive layer including a material having an adhesive component to serve to adhesively fix the transferred light-emitting element 300 to the substrate. The material is not particularly limited.

The reflective electrode layer 250 may be disposed on the fixing layer 240. The light-emitting element 300 may be disposed on the reflective electrode layer 250.

The reflective electrode layer 250 may be formed to have the pattern corresponding to the lower surface of the light-emitting element 300.

The reflective electrode layer 250 and the light-emitting element 300 positioned on the reflective electrode layer 250 may be fixed to each other via the fixing layer 240.

An insulating pattern layer 260 capable of insulating the reflective electrode layer 250 and the light-emitting element 300 from each other may be formed between the reflective electrode layer 250 and the light-emitting element 300.

As the reflective electrode layer 250 is formed to have the pattern corresponding to the lower surface of the light-emitting element 300, the insulating pattern layer 260 may be formed to have a pattern corresponding to the lower surface of the light-emitting element 300.

An example in which the light-emitting element 300 is embodied as a micro-LED element will be described.

The light-emitting element 300 may include a light-emissive layer having a stack structure in which a first semiconductor layer 301, a first active layer 302, and a second semiconductor layer 303 are sequentially stacked, and a first electrode 304 and a second electrode 305 disposed on an upper surface of the light-emissive layer, and electrically connected thereto.

In this case, the first electrode 304 may be an n-type electrode, and the second electrode 305 may be a p-type electrode.

The light-emissive layer may emit light via recombination of electrons and holes based on current flowing between the first electrode 304 and the second electrode 305.

The first semiconductor layer 301 may provide electrons to the first active layer 302.

The first active layer 302 may be disposed on one side of the first semiconductor layer 301.

The first active layer 302 may include a multi-quantum well (MQW) structure having a well layer and a barrier layer having a higher band gap than that of the well layer.

The second semiconductor layer 303 may be disposed on the first active layer 302 so as to provide holes to the first active layer 302.

The second electrode 305 may be disposed on the second semiconductor layer 303. The second electrode 305 may act as a cathode electrode providing holes to the second semiconductor layer 303.

The first electrode 304 may be disposed on the other side of the first semiconductor layer 301 so as to be electrically isolated from the first active layer 302 and the second semiconductor layer 303. The first electrode 304 may act as an anode electrode providing electrons to the first semiconductor layer 301.

A fourth insulating layer 124 may be disposed on the fixing layer 240 and the light-emitting element 300.

On the fourth insulating layer 124, a first connection electrode 341 may be disposed. The first connection electrode 341 may electrically connect the first electrode 304 of the light-emitting element 300 and the reflective plate 200 to each other via a contact-hole formed in the fourth insulating layer 124 and the fixing layer 240.

In addition, on the fourth insulating layer 124, a second connection electrode 342 may be disposed. The second connection electrode 342 may electrically connect the second electrode 305 of the light-emitting element 300 and the common line 114 to each other via a contact-hole formed in the fourth insulating layer 124, the fixing layer 240, and the third insulating layer 123.

A first protection layer 351 and a second protection layer 352 protecting the light-emitting element 300 may be sequentially formed on the first connection electrode 341 and the second connection electrode 342.

In this case, each of the first protection layer 351 and the second protection layer 352 may include an organic material layer or an inorganic material layer, or a stack of a plurality of organic material layers and inorganic material layers.

Figure 6:
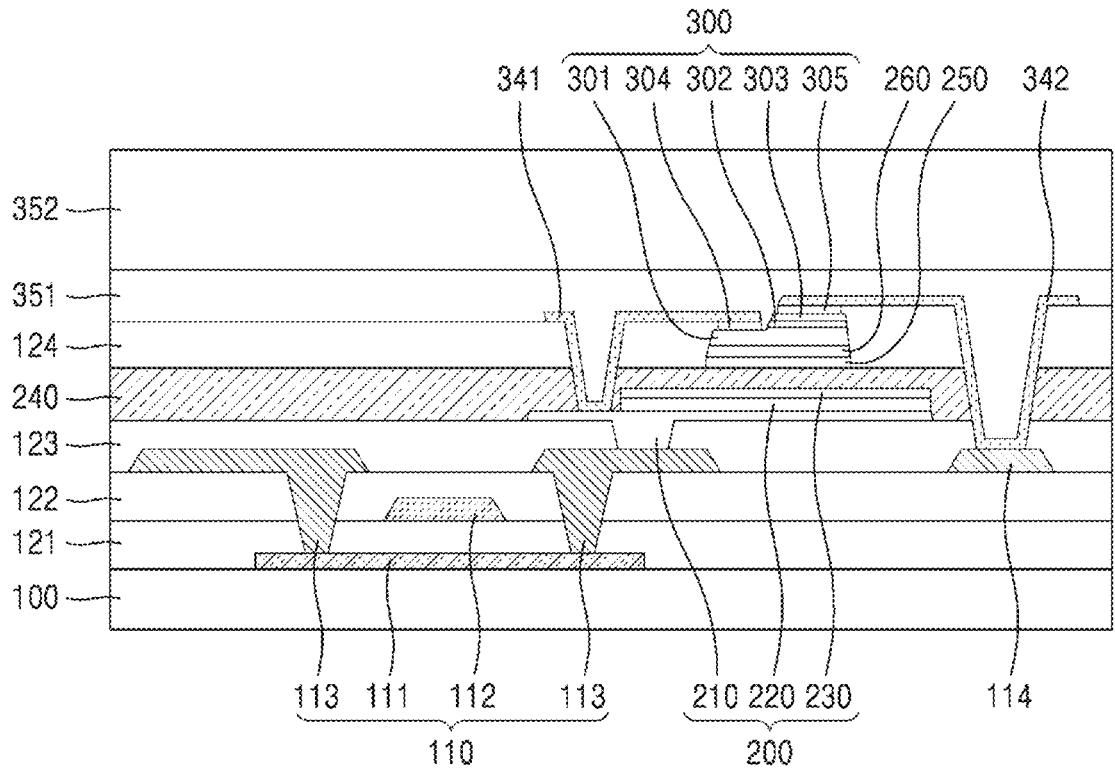
FIG. 6 is a cross-sectional view of a display device corresponding to one sub-pixel according to a second embodiment of the present disclosure.

A second embodiment may be described with reference to FIG. 6.

In additional embodiments including the second embodiment as described below, those duplicate with the descriptions of the first embodiment as set forth above will be omitted, and following descriptions will be based on differences therebetween.

The second embodiment is different from the first embodiment in terms of a connection structure between the reflective plate 200 and the first connection electrode 341.

In the second embodiment, the second reflective plate layer 220 included in the reflective plate 200 is a transparent insulating layer.

When the second reflective plate layer 220 as the transparent insulating layer is disposed between the first reflective plate layer 210 as the metal layer and the third reflective plate layer 230 as the metal layer, the electricity may not be conducted in the area where the first reflective plate layer 210, the second reflective plate layer 220, and the third reflective plate layer 230 are stacked.

Therefore, in the second embodiment, in order that the reflective plate 200 is electrically connected to the first connection electrode 341, the reflective plate 200 may be patterned so that only the first reflective plate layer 210 is disposed in an area of the reflective plate 200 in which the reflective plate 200 contacts the first connection electrode 341.

That is, in the second embodiment, only the first reflective plate layer 210 may be disposed in an area where a contact-hole is defined in the fixing layer 240 formed on the reflective plate 200, and in the fourth insulating layer 124.

Accordingly, the first connection electrode 341 may contact and be electrically connected to an upper surface of the first reflective plate layer 210.

Figure 7:
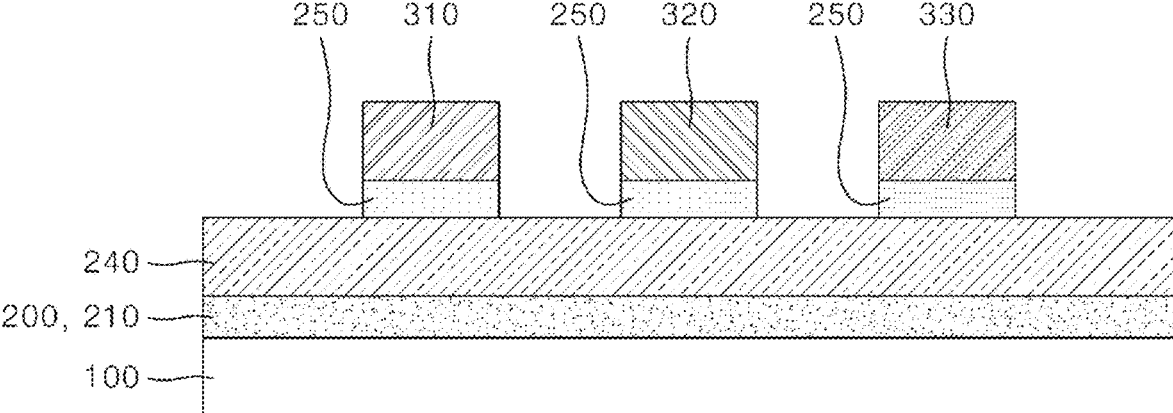
FIG. 7 is a cross-sectional view of a display device corresponding to one pixel according to a third embodiment of the present disclosure.
Figure 8:
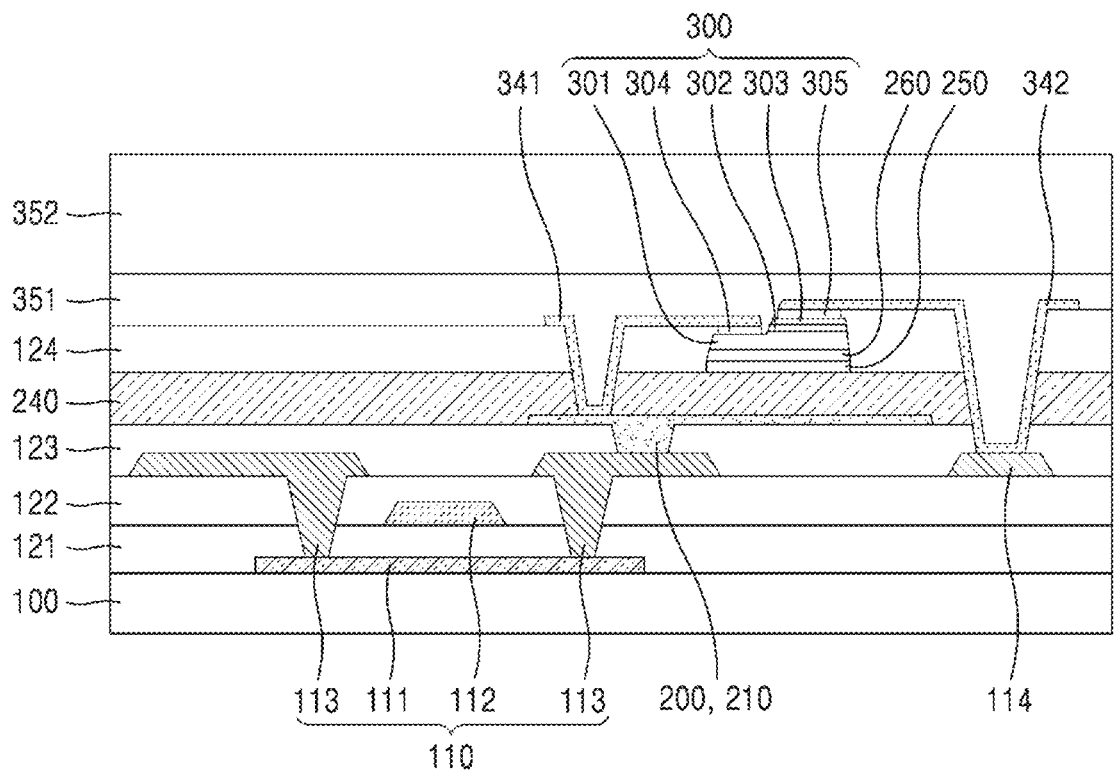
FIG. 8 is a cross-sectional view of a display device corresponding to one sub-pixel according to a third embodiment of the present disclosure.
Figure 9:
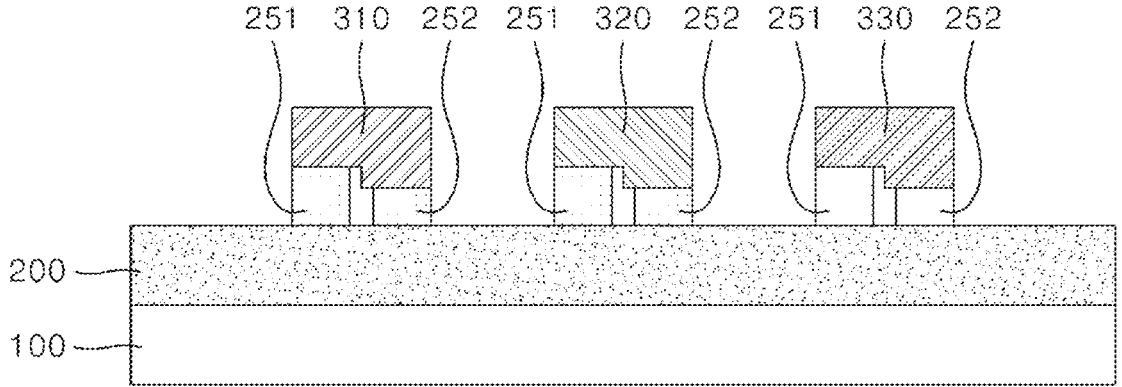
FIG. 9 is a plan view of a display device according to a fourth embodiment of the present disclosure.
Figure 10:
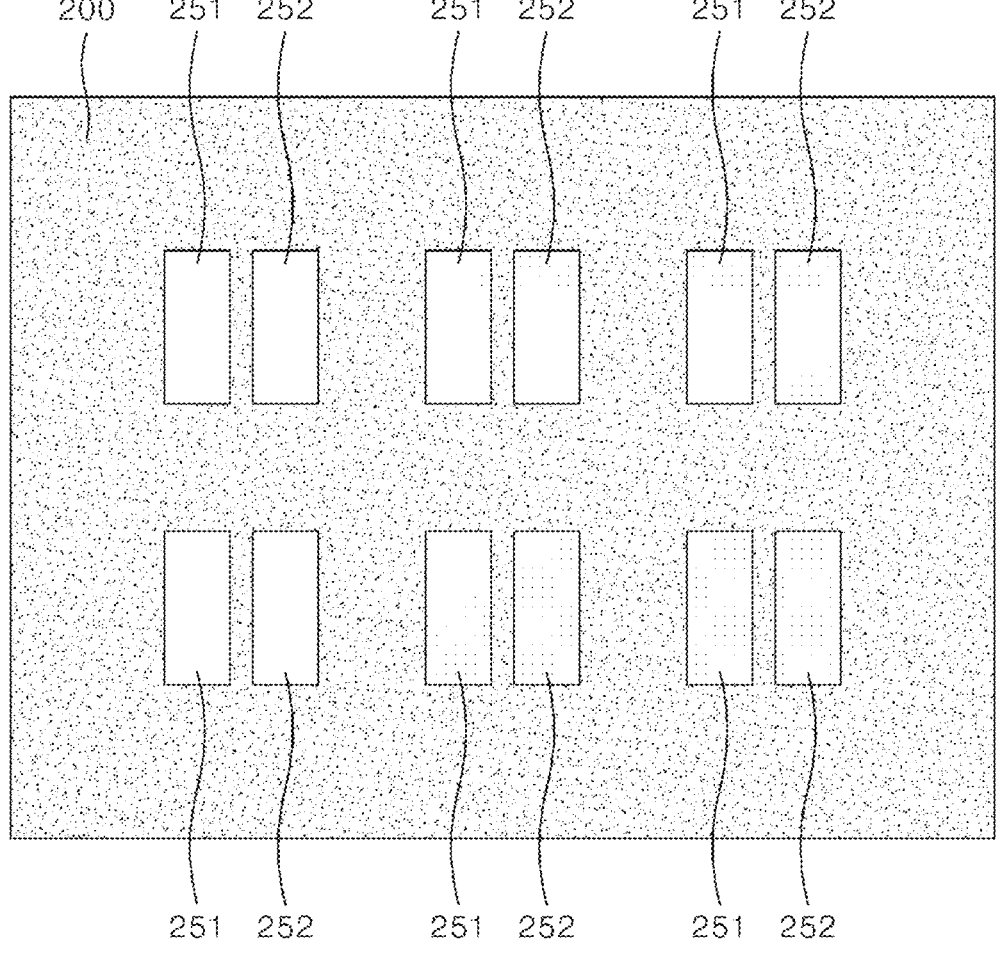
FIG. 10 is a plan view of a reflective plate corresponding to one pixel according to a fourth embodiment of the present disclosure.
Figure 11:
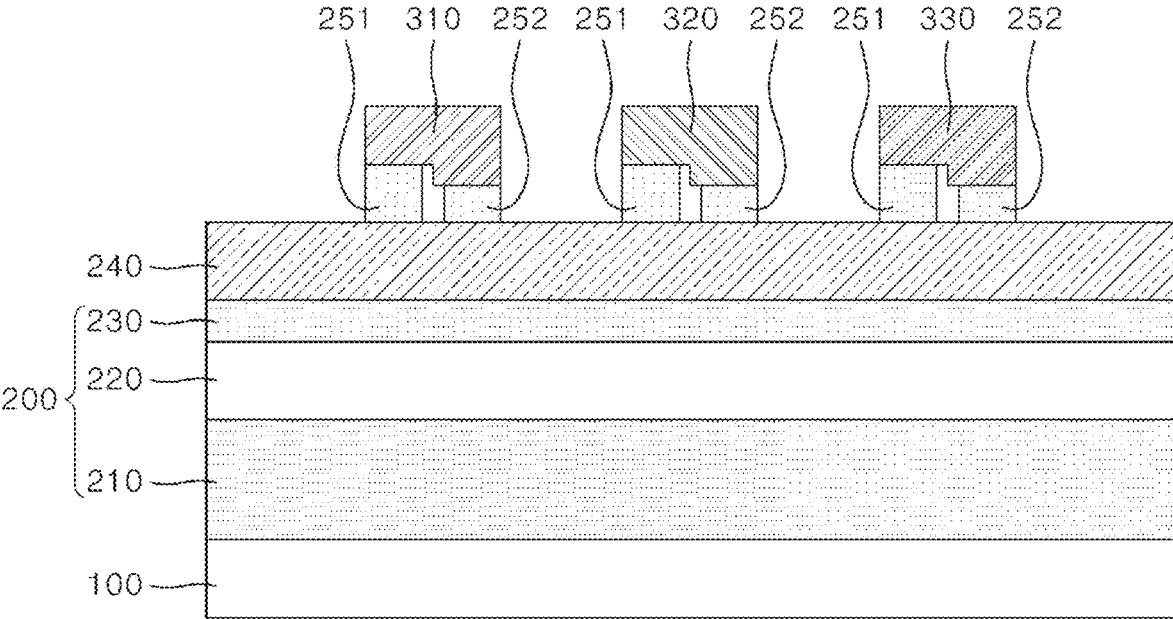
FIG. 11 is a cross-sectional view of a display device corresponding to one pixel according to a fourth embodiment of the present disclosure.

A third embodiment may be described with referring to FIG. 7 and FIG. 8.

The reflective plate 200 according to the third embodiment may be composed of a single layer composed only of the first reflective plate layer 210.

In this case, the reflective plate 200 may be made of a material including a conductive black matrix.

For example, the conductive black matrix may be embodied as a low resistance black matrix.

The low-resistance black matrix may include a low-resistance resin. The low-resistance resin may have a resistance range of $10^4\Omega$ to $10^7\Omega$. However, the present disclosure is not limited thereto.

Alternatively, the conductive black matrix may include carbon or graphene.

As described above, the reflective plate 200 according to the third embodiment is made of the conductive black matrix as a material other than the metal. Thus, the reflective plate 200 having the low reflectance may be implemented more easily than the reflective plate 200 including the metal layer may be implemented.

Further, the conductive black matrix may conduct electricity. Thus, the reflective plate 200 may perform not only a function of the black matrix of the low reflectance, but also a function of a connection electrode that electrically connects the drain electrode of the source/drain electrodes 113 and the first connection electrode 341 to each other at the same time.

Hereinafter, referring to FIG. 9 to FIG. 12, a display device according to the fourth embodiment of the present disclosure will be described.

According to the fourth embodiment, the reflective electrode layer 250 disposed on the reflective plate 200 may include a first reflective electrode layer 251 and a second reflective electrode layer 252 having a pattern corresponding to the lower surface of the light-emitting element 300.

In this case, the light-emitting element 300 according to the fourth embodiment may be obtained by turning upside down the light-emitting element 300 according to each of the first to third embodiments.

Figure 12:
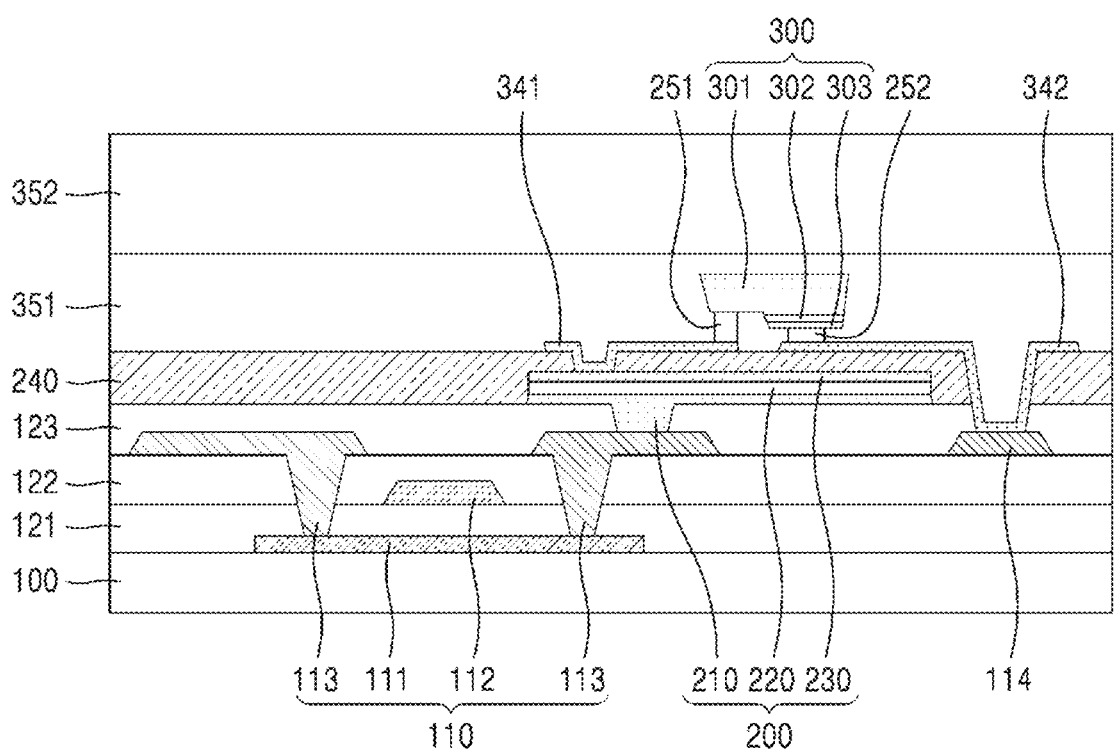
FIG. 12 is a cross-sectional view of a display device corresponding to one sub-pixel according to a fourth embodiment of the present disclosure.

Therefore, referring to FIG. 12, the light-emitting element 300 may have a structure in which the second semiconductor layer 303 of the light-emitting element 300 constitutes a lower portion of the light-emitting element 300, and the first active layer 302 and the first semiconductor layer 301 are sequentially stacked on the second semiconductor layer 303.

In this case, the first reflective electrode layer 251 may function as an n-type electrode as a first electrode electrically connected to the first semiconductor layer 301, while the second reflective electrode layer 252 may function as a p-type electrode as a second electrode electrically connected to the second semiconductor layer 303.

Therefore, according to an embodiment of the present disclosure, the first reflective electrode layer 251 and the second reflective electrode layer 252 may respectively serve as the n-type electrode and the p-type electrode electrically connected to the light-emitting element 300. Thus, a separate n-type electrode and a separate p-type electrode other than the reflective electrode layer may not be formed, thereby increasing process efficiency and optimizing the process.

In this case, a vertical level of a lower surface of the first semiconductor layer 301 and that of a lower surface of the second semiconductor layer 303 are different from each other to form a step. Thus, the first reflective electrode layer 251 and the second reflective electrode layer 252 may be formed to have different heights, and may respectively contact the first semiconductor layer 301 and the second semiconductor layer 303 and respectively support the first semiconductor layer 301 and the second semiconductor layer 303, thereby compensating for the step.

Accordingly, the first reflective electrode layer 251 may be formed to have a height larger than that of the second reflective electrode layer 252.

Further, the first reflective electrode layer 251 and the second reflective electrode layer 252 corresponding to one light-emitting element 300 may be formed so as to be spaced apart from each other.

If the first reflective electrode layer 251 and the second reflective electrode layer 252 are not spaced apart from each other but are connected to each other or are formed integrally with each other, a short circuit may occur between the first reflective electrode layer 251 and the second reflective electrode layer 252 which respectively function as the n-type electrode and the p-type electrode of the light-emitting element 300.

Accordingly, the first reflective electrode layer 251 and the second reflective electrode layer 252 may have patterns corresponding to lower surfaces of the first semiconductor layer 301 and the second semiconductor layer 303, respectively, and may be formed to be spaced apart from each other. Thus, the light-emitting element 300 may stably emit light while having high light efficiency.

Figure 13:
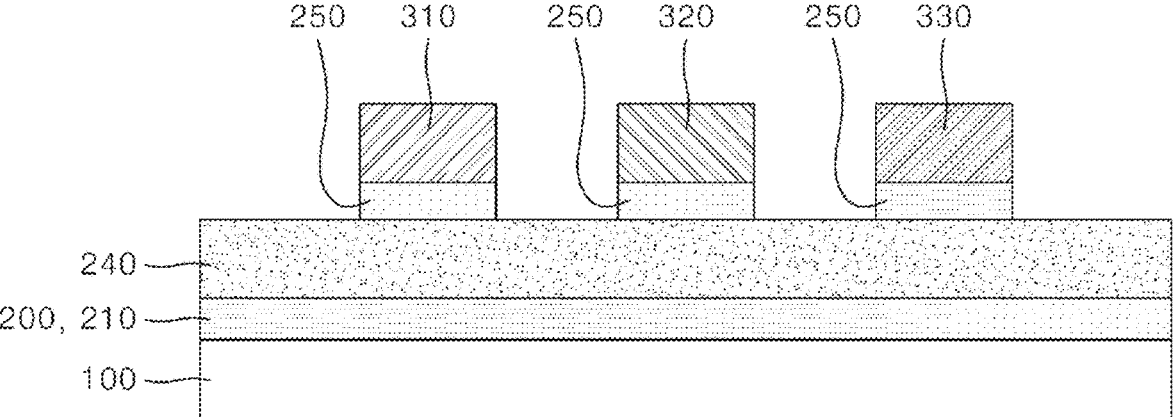
FIG. 13 is a cross-sectional view of a display device corresponding to one pixel according to a fifth embodiment of the present disclosure.
Figure 14:
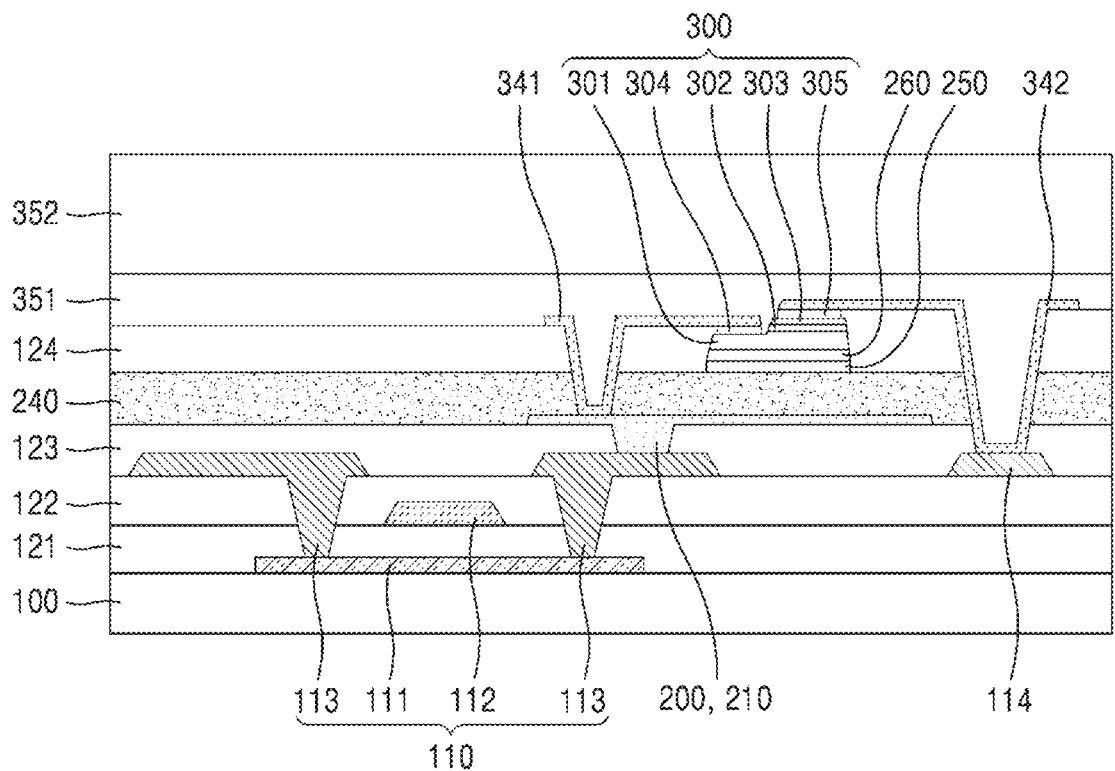
FIG. 14 is a cross-sectional view of a display device corresponding to one sub-pixel according to a fifth embodiment of the present disclosure.

A fifth embodiment may be described with referring to FIG. 13 and FIG. 14.

The fixing layer according to the fifth embodiment may be made of a material including an adhesive black matrix.

The fixing layer 240 may be formed to have a reflectance of light of a wavelength of 550 nm lower than that of the reflective electrode layer 250. Thus, the reflective electrode layer 250 may have a reflectance of light of a wavelength of 550 nm higher than that of the fixing layer 240.

For example, the adhesive black matrix may be composed of an adhesive component material having an adhesive component and carbon black or black dye added thereto. Thus, the fixing layer having the low reflectance may be obtained.

The black die may be obtained by mixing red die, green die, and blue die with each other at an appropriate mixing ratio.

In this way, the fixing layer 240 disposed under the light-emitting element 300 may be act a constituent layer that may serve as a low reflectance reflective plate. Thus, not only a freedom in terms of a material choice of the reflective plate may be increased, but also the light reflectance of an area other than the area corresponding to the light-emitting element may be more effectively lowered.

In addition, the fixing layer 240 may act as a constituent layer that may serve as the low-reflectance reflective plate, the low-reflective layer may be formed under the light-emitting element 300 without patterning the reflective plate 200 or without forming an additional layer. Thus, a very effective low reflective layer may be formed by improving the black performance while obtaining high process efficiency.

A display device according to an embodiment of the present disclosure as described above may be described as follows.

A first aspect of the present disclosure provides a display panel comprising: a substrate; a reflective plate disposed on the substrate; a reflective electrode layer disposed on the reflective plate; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the reflective plate.

In one implementation of the first aspect, the reflective plate has a larger area size than an area size of the reflective electrode layer.

In one implementation of the first aspect, the reflective electrode layer includes a plurality of reflective electrode layers, wherein adjacent reflective electrode layers are spaced apart from each other.

In one implementation of the first aspect, the reflective plate includes a first reflective plate layer, a second reflective plate layer, and a third reflective plate layer sequentially stacked, wherein each of the first reflective plate layer and the third reflective plate layer is a metal layer, wherein the second reflective plate layer is a transparent layer.

In one implementation of the first aspect, the first reflective plate layer and the third reflective plate layer include the same metal.

In one implementation of the first aspect, a thickness of the third reflective plate layer is smaller than a thickness of the first reflective plate layer.

In one implementation of the first aspect, the metal layer includes at least one selected from a group consisting of aluminum (Al), silver (Ag), molybdenum (Mo), titanium (Ti), and an alloy of at least two thereof.

In one implementation of the first aspect, the transparent layer is a conductive oxide layer or a transparent insulating layer.

In one implementation of the first aspect, the reflective plate includes a conductive black matrix.

In one implementation of the first aspect, the reflective electrode layer includes a first reflective electrode layer and a second reflective electrode layer having a pattern corresponding to a lower surface of the light-emitting element, wherein the first reflective electrode layer and the second reflective electrode layer are spaced apart from each other.

In one implementation of the first aspect, the first reflective electrode layer and the second reflective electrode layer have different heights.

A second aspect of the present disclosure provides a display panel comprising: a substrate; a reflective plate disposed on the substrate; a fixing layer disposed on the reflective plate; a reflective electrode layer disposed on the fixing layer; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the fixing layer.

In one implementation of the second aspect, the fixing layer includes an adhesive black matrix.

A third aspect of the present disclosure provides a display device comprising: a substrate; a thin-film transistor including a pair of source/drain electrodes; a reflective plate electrically connected to one of the source/drain electrodes; a reflective electrode layer disposed on the reflective plate; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the reflective plate.

In one implementation of the third aspect, the reflective plate includes a first reflective plate layer, a second reflective plate layer, and a third reflective plate layer sequentially stacked, wherein each of the first reflective plate layer and the third reflective plate layer is a metal layer, wherein the second reflective plate layer is a transparent layer.

In one implementation of the third aspect, the reflective plate includes a conductive black matrix.

In one implementation of the third aspect, the reflective electrode layer includes a first reflective electrode layer and a second reflective electrode layer having a pattern corresponding to a lower surface of the light-emitting element, wherein the first reflective electrode layer and the second reflective electrode layer are spaced apart from each other.

In one implementation of the third aspect, each of the first reflective electrode layer and the second reflective electrode layer is electrically connected to the light-emitting element.

A fourth aspect of the present disclosure provides a display device comprising: a substrate; a thin-film transistor including a pair of source/drain electrodes; a reflective plate electrically connected to one of the source/drain electrodes; a fixing layer disposed on the reflective plate; a reflective electrode layer disposed on the fixing layer; and a light-emitting element disposed on the reflective electrode layer, wherein the reflective electrode layer has a pattern corresponding to a lower surface of the light-emitting element, wherein the reflective electrode layer has a reflectance of light of a wavelength 550 nm greater than a reflectance of light of a wavelength 550 nm of the fixing layer.

In one implementation of the fourth aspect, the fixing layer includes an adhesive black matrix.

Although the embodiments of the present disclosure have been described in more detail with reference to the accompanying drawings, the present disclosure is not necessarily limited to these embodiments, and may be modified in a various manner within the scope of the technical spirit of the present disclosure. Accordingly, the embodiments as disclosed in the present disclosure are intended to describe rather than limit the technical idea of the present disclosure, and the scope of the technical idea of the present disclosure is not limited by these embodiments. Therefore, it should be understood that the embodiments described above are not restrictive but illustrative in all respects.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display panel, comprising:
a substrate;
a reflective plate disposed on the substrate;
a reflective electrode layer disposed on the reflective plate; and
a light-emitting element disposed on the reflective electrode layer,
wherein the reflective electrode layer has a pattern corresponding to a lower surface of the light-emitting element, and
wherein the reflective electrode layer has a reflectance of light of a wavelength 550 nm greater than a reflectance of light of a wavelength 550 nm of the reflective plate.

2. The display panel of claim 1, wherein the reflective plate has a larger area size than an area size of the reflective electrode layer.

3. The display panel of claim 1, wherein the reflective electrode layer includes a plurality of reflective electrode layers, and
wherein adjacent reflective electrode layers are spaced apart from each other.

4. The display panel of claim 1, wherein the reflective plate includes a first reflective plate layer, a second reflective plate layer, and a third reflective plate layer sequentially stacked,
wherein each of the first reflective plate layer and the third reflective plate layer is a metal layer, and
wherein the second reflective plate layer is a transparent layer.

5. The display panel of claim 4, wherein the first reflective plate layer and the third reflective plate layer include a same metal.

6. The display panel of claim 4, wherein a thickness of the third reflective plate layer is smaller than a thickness of the first reflective plate layer.

7. The display panel of claim 4, wherein the metal layer includes at least one selected from a group consisting of aluminum (Al), silver (Ag), molybdenum (Mo), titanium (Ti), and an alloy of at least two thereof.

8. The display panel of claim 4, wherein the transparent layer is a conductive oxide layer or a transparent insulating layer.

9. The display panel of claim 1, wherein the reflective plate includes a conductive black matrix.

10. The display panel of claim 1, wherein the reflective electrode layer includes a first reflective electrode layer and a second reflective electrode layer having a pattern corresponding to a lower surface of the light-emitting element, and wherein the first reflective electrode layer and the second reflective electrode layer are spaced apart from each other.

11. The display panel of claim 10, wherein the first reflective electrode layer and the second reflective electrode layer have different heights.

12. A display panel, comprising:

a substrate;

a reflective plate disposed on the substrate;

a fixing layer disposed on the reflective plate;

a reflective electrode layer disposed on the fixing layer; and a light-emitting element disposed on the reflective electrode layer, wherein the reflective electrode layer has a pattern corresponding to a lower surface of the light-emitting element, and wherein the reflective electrode layer has a reflectance of light of a wavelength 550 nm greater than a reflectance of light of a wavelength 550 nm of the fixing layer.

13. The display panel of claim 12, wherein the fixing layer includes an adhesive black matrix.

14. A display device, comprising:

a substrate;

a thin-film transistor including source/drain electrodes;

a reflective plate electrically connected to one of the source/drain electrodes;

a reflective electrode layer disposed on the reflective plate; and a light-emitting element disposed on the reflective electrode layer, wherein the reflective electrode layer has a pattern corresponding to a lower surface of the light-emitting element, and wherein the reflective electrode layer has a reflectance of light of a wavelength 550 nm greater than a reflectance of light of a wavelength 550 nm of the reflective plate.

15. The display device of claim 14, wherein the reflective plate includes a first reflective plate layer, a second reflective plate layer, and a third reflective plate layer sequentially stacked, wherein each of the first reflective plate layer and the third reflective plate layer is a metal layer, and wherein the second reflective plate layer is a transparent layer.

16. The display device of claim 14, wherein the reflective plate includes a conductive black matrix.

17. The display device of claim 14, wherein the reflective electrode layer includes a first reflective electrode layer and a second reflective electrode layer having a pattern corresponding to a lower surface of the light-emitting element, and wherein the first reflective electrode layer and the second reflective electrode layer are spaced apart from each other.

18. The display device of claim 17, wherein each of the first reflective electrode layer and the second reflective electrode layer is electrically connected to the light-emitting element.

19. A display device, comprising:

a substrate;

a thin-film transistor including source/drain electrodes;

a reflective plate electrically connected to one of the source/drain electrodes;

a fixing layer disposed on the reflective plate;

a reflective electrode layer disposed on the fixing layer; and a light-emitting element disposed on the reflective electrode layer, wherein the reflective electrode layer has a pattern corresponding to a lower surface of the light-emitting element, and wherein the reflective electrode layer has a reflectance of light of a wavelength 550 nm greater than a reflectance of light of a wavelength 550 nm of the fixing layer.

20. The display device of claim 19, wherein the fixing layer includes an adhesive black matrix.

* * * * *